(12) United States Patent
Chiu et al.

(10) Patent No.: US 8,674,480 B2
(45) Date of Patent: Mar. 18, 2014

(54) HIGH VOLTAGE BIPOLAR TRANSISTOR WITH PSEUDO BURIED LAYERS

(75) Inventors: Tzuyin Chiu, Shanghai (CN); TungYuan Chu, Shanghai (CN); Wensheng Qian, Shanghai (CN); YungChieh Fan, Shanghai (CN); Jun Hu, Shanghai (CN); Donghua Liu, Shanghai (CN); Yukun Lv, Shanghai (CN)

(73) Assignee: Shanghai Hua Hong NEC Electronics Company, Limited, Shanghai (CN)

( * ) Notice: Subject to any disclaimer, the term of this patent is extended or adjusted under 35 U.S.C. 154(b) by 0 days.

(21) Appl. No.: 12/966,078

(22) Filed: Dec. 13, 2010

(65) Prior Publication Data

US 2011/0140239 A1    Jun. 16, 2011

(30) Foreign Application Priority Data

Dec. 15, 2009    (CN) .......................... 2009 1 0201946

(51) Int. Cl.
*H01L 29/66* (2006.01)

(52) U.S. Cl.
USPC .................................. 257/565; 257/E29.034

(58) Field of Classification Search
USPC .......... 257/575, E27.055, 656, 556, 557, 561, 257/563, 574, 564, 565, 588, 514, 515, 518, 257/E27.032, E27.057, E27.064, E29.034, 257/E29.18, E29.185, 525, 526, E29.171, 257/E29.114, 576, 567
See application file for complete search history.

(56) References Cited

U.S. PATENT DOCUMENTS

| | | | |
|---|---|---|---|
| 6,518,111 B1 * | 2/2003 | Johnson ........................ | 438/202 |
| 6,724,066 B2 * | 4/2004 | Swanson et al. ............... | 257/557 |
| 6,774,455 B2 * | 8/2004 | Babcock et al. ............... | 257/526 |
| 6,815,801 B2 * | 11/2004 | Romas et al. .................. | 257/566 |
| 7,136,268 B2 * | 11/2006 | Stricker et al. .................. | 361/56 |
| 7,696,582 B2 * | 4/2010 | Arai et al. ...................... | 257/374 |
| 2002/0130370 A1 * | 9/2002 | Suzuki .......................... | 257/378 |
| 2002/0160562 A1 * | 10/2002 | Babcock et al. ............... | 438/207 |
| 2004/0048428 A1 * | 3/2004 | Tanomura ...................... | 438/199 |
| 2004/0222495 A1 * | 11/2004 | Cantell et al. .................. | 257/565 |
| 2005/0151223 A1 * | 7/2005 | Voldman ....................... | 257/510 |
| 2006/0105517 A1 * | 5/2006 | Johansson et al. ............. | 438/205 |
| 2007/0275535 A1 * | 11/2007 | Khater et al. .................. | 438/345 |
| 2008/0076228 A1 * | 3/2008 | Dyson et al. ................... | 438/309 |
| 2008/0237656 A1 * | 10/2008 | Williams et al. ............... | 257/262 |
| 2009/0014838 A1 * | 1/2009 | Arai et al. ...................... | 257/566 |

* cited by examiner

*Primary Examiner* — Daniel Luke
*Assistant Examiner* — Latanya N Crawford
(74) *Attorney, Agent, or Firm* — Ming Chow; Sinorica, LLC

(57) ABSTRACT

A high voltage bipolar transistor with shallow trench isolation (STI) comprises the areas of a collector formed by implanting first electric type impurities into active area and connected with pseudo buried layers at two sides; Pseudo buried layers which are formed by implanting high dose first type impurity through the bottoms of STI at two sides if active area, and do not touch directly; deep contact through field oxide to contact pseudo buried layers and pick up the collectors; a base deposited on the collector by epitaxial growth and in-situ doped by second electric type impurity, in which the intrinsic base touches local collector and extrinsic base is used for base pick-up; a emitter which is a polysilicon layer deposited on the intrinsic base and doped with first electric type impurities. This invention makes the depletion region of collector/base junction from 1D (vertical) distribution to 2D (vertical and lateral) distribution. The bipolar transistor's breakdown voltages are increased by only enlarge active critical dimension (CD). This is low-cost process.

9 Claims, 8 Drawing Sheets

HIGH VOLTAGE BIPOLAR TRANSISTOR WITH PSEUDO BURIED LAYERS

The current application claims a foreign priority to an application in China of serial number 200910201946.3 filed on Dec. 15, 2009.

FIELD OF THE INVENTION

This invention relates generally to semiconductor devices in integrated circuits. More particularly it relates to HV bipolar transistor design and fabrication.

BACKGROUND OF THE INVENTION

The background of the invention is illustrated with the example of NPN transistor. Current bipolar transistor's structure is shown as FIG. 1 including collector 114, base 111 and emitter 110. Collector 114 is N− epitaxial layer grown on N+ buried layer 102, Collector area is picked up by N-type heavy doped buried layer 102 on substrate 102, N-type high doped collector pick-up 104 in active area, deep contact 106 in interlayer dielectric (ILD) 105 and metal electrode 107. N-type high doped collector pick-up 104 is formed by high dose and high energy implant. Collector 114 is isolated by shallow trench isolation (STI) 103. Between transistors, there is a deep trench 115 filled with polysilicon on the bottom of STI to reduce the parasitic capacitor of collector/substrate and improve transistor frequency performance. Base 111 is a in-situ P-type doped epitaxial layer and is picked up by poly layer 108 above oxide dielectric 113. Emitter 110 is N-type heavy doping polysilicon layer on base 111. Emitter 110 is surrounded by oxide sidewall 112. Emitter 110 touches base 111 directly by emitter window in oxide 109. Local collector implants can be done through emitter window to adjust transistor's breakdown voltage and cutoff frequency. In current process, in order to increase breakdown voltage of HV transistors, collector epitaxial thickness needs to be increased to enlarge depletion width of collector/base junction. As the result, the process cost is high, also high frequency and high voltage bipolar transistors are hard to be integrated.

DETAILED DESCRIPTION OF THE INVENTION

The invention is to provide a high voltage bipolar transistor in which the breakdown voltage is increased by enlarging active critical dimension (CD) and making the depletion region of collector/base junction from 1D (vertical) distribution to 2D (vertical and lateral) distribution. The invention is low cost process.

Active areas of HV bipolar transistor in this invention are isolated by shallow trench isolation (STI). The transistor comprises:

a collector, the active area with first electric type impurity doping by implants. The implants into collector can be single one or multiple steps. The implant energy is less than 500 KeV, and implant dose is less than 1e14 cm$^{-2}$. The implant dose and energy can be determined by transistor breakdown voltage. Collector is connected with pseudo buried layers at two sides. Pseudo buried layers are formed by implanting high dose first type impurity through the bottoms of STI at two sides, do not touch directly and linked up by the collector; Deep contacts through field oxide touch pseudo buried layers and pick up the collector. Deep contacts in the collector are coated Ti/TiN buffer metal layers and then plugged in Tungsten to have ohmic contacts. First electric type impurities of high dose can be implanted into the bottoms of deep contacts in the collector after deep contact etch to realize better ohmic contacts of the collector.

a base, the epitaxial layer with second electric type impurity in-situ doping on the collector. Base comprises intrinsic and extrinsic base, and can be silicon, SiGe or SiGeC materials. Intrinsic base touches the collector. Extrinsic base surrounds intrinsic base and pick up base by metal contacts.

an emitter, a polysilicon layer with first electric type doping, being picked up by metal contacts directly. Intrinsic base is as large as poly emitter or smaller than poly emitter to ensure the impurities of extrinsic base implant do not dope intrinsic base. Without extrinsic base implant, base can be picked up by salicide process.

For NPN transistors, first electric type is N type, second electric type is P type. For PNP transistors, first electric type is P type, second electric type is N type.

Pseudo buried layers are fabricated at the bottom of STI, surround active area and connected to the collector by lateral diffusion into active area. Pseudo buried layer implant conditions are as following, N type as first electric type impurity: dose range 1e14~1e16 cm$^{-2}$, energy less than 5 keV, the impurity can be Arsenic or Phosphorus; P type as first electric type impurity: dose range 1e14~1e16 cm$^{-2}$, energy less than 5 keV, the impurity can be Boron, BF2 or Indium.

The breakdown voltages of HV Bipolar transistors can be adjusted by tuning active CDs.

HV bipolar transistor in this invention is quite different from conventional one. There is no collector epitaxial layer and it is not necessary to increase the thickness of epitaxial layer for higher breakdown voltage. This invention makes the depletion region of collector/base junction from 1D (vertical) distribution to 2D (vertical and lateral) distribution so as to increase transistor's breakdown voltage by increasing active CD and increasing the distance between heavy doping pseudo buried layers and base. This invention is low-cost process, has smaller transistor area, reduces parasitic effect and can be integrated with high frequency transistors.

BRIEF DESCRIPTION OF THE DRAWINGS

The foregoing and the object, features, and advantages of the invention will be apparent from the following detailed description of the invention, as illustrated in the accompanying drawings, in which.

DESCRIPTION OF THE PREFERRED EMBODIMENTS

Figure 1:
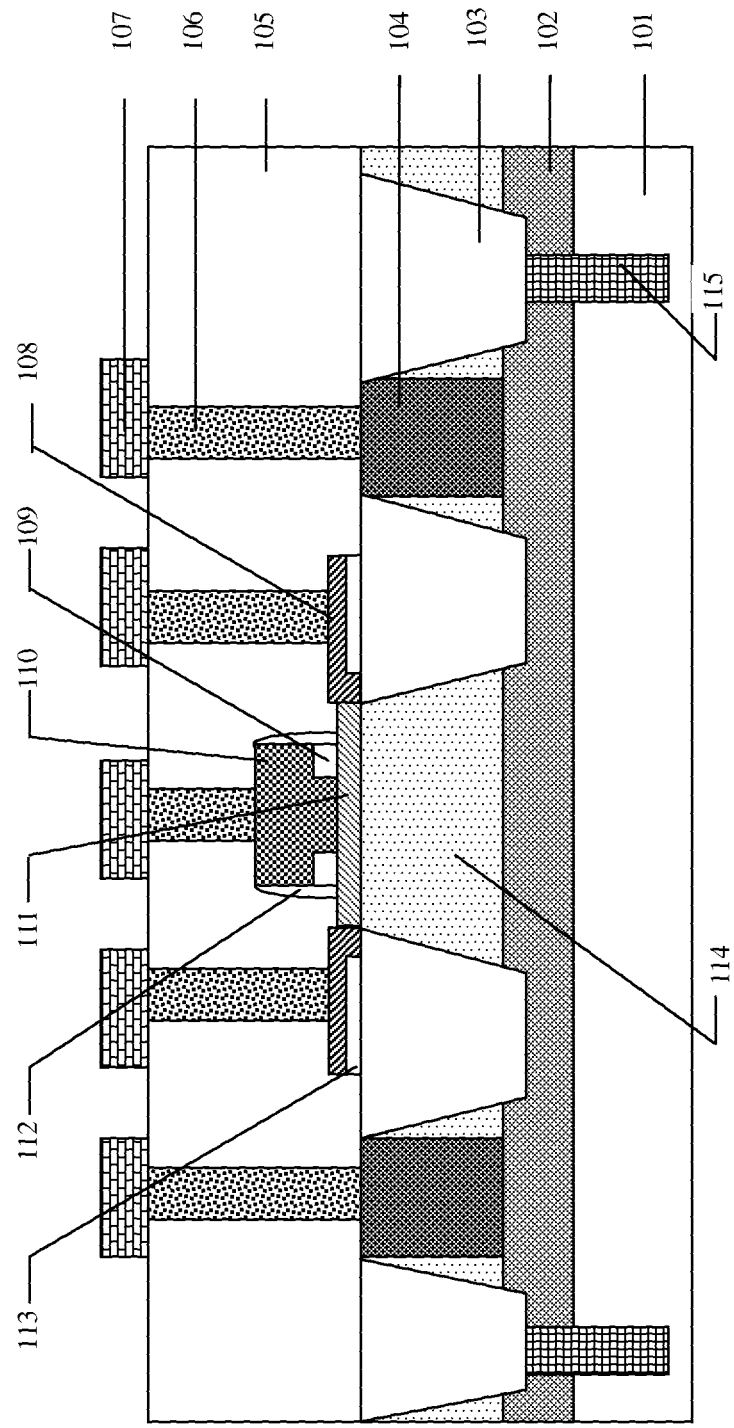
FIG. 1 is cross sectional view showing the structure of conventional bipolar transistors.
Figure 2:
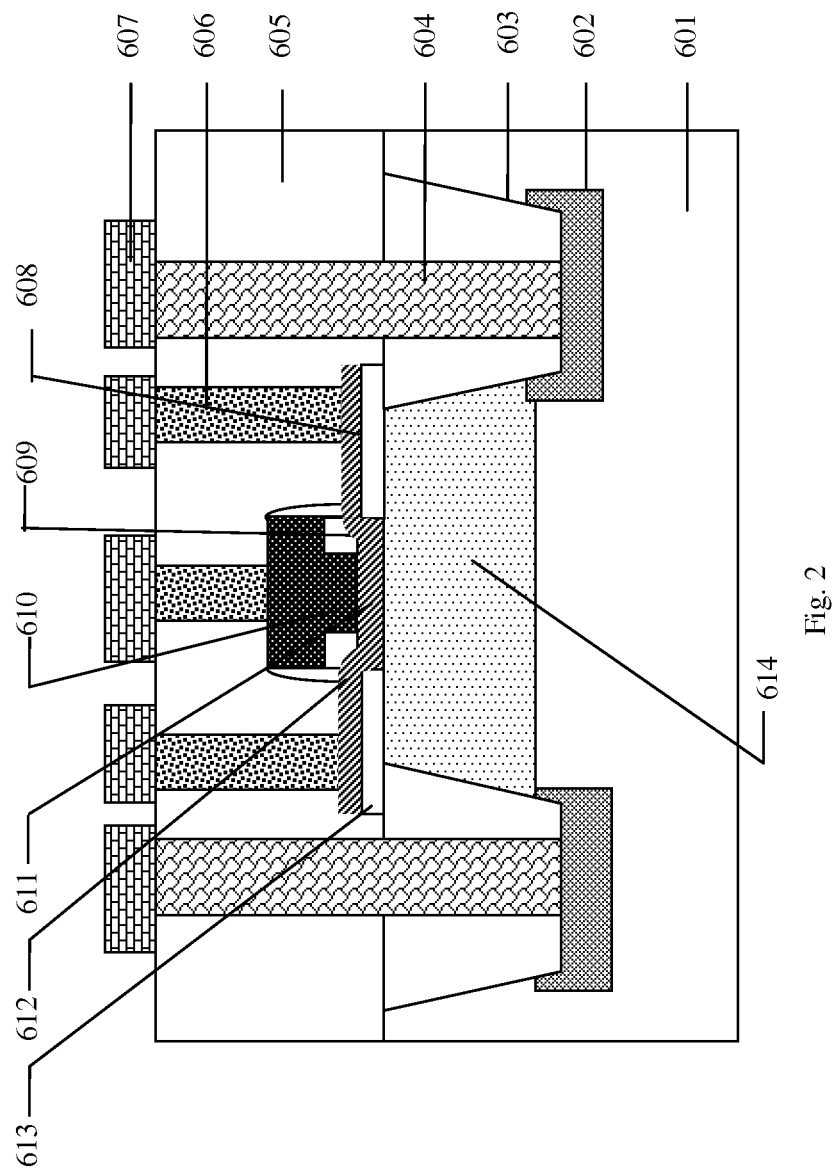
FIG. 2 is cross sectional view showing the structure of HV bipolar transistors in the invention.

FIG. 2 is cross sectional view showing the structure of HV bipolar transistors in the invention.

Active areas of HV bipolar transistor in this invention are isolated by shallow trench isolation (STI). The transistor comprises:

a collector 614, the active area with first electric type impurity doping by implants. The implants into collector can be single one or multiple steps. The implant energy is less than 500 KeV, and implant dose is less than 1e14 cm$^{-2}$. The implant dose and energy can be determined by transistor breakdown voltage. Collector 614 is connected with pseudo buried layers 602 at two sides. Pseudo buried layers 602 are formed by implanting high dose first type impurity through the bottoms of STI at two sides, do not touch directly and are linked up by the collector; Deep contacts 604 through field oxide touch pseudo buried layers 602 and pick up the collector 614. Deep contacts 604 in the collector 614 are coated Ti/TiN buffer metal layers and then plugged in Tungsten to have ohmic contacts. First electric type impurities of high dose can be implanted into the bottoms of deep contacts 604 in the collector after deep contact etch to realize better ohmic contacts of the collector.

a base, the epitaxial layer with second electric type impurity in-situ doping on the collector 614. Base comprises intrinsic base 611 and extrinsic base 608, and can be silicon, SiGe or SiGeC materials. Intrinsic base 611 touches the collector 614. Intrinsic base 611 is crystalline layer while extrinsic base 608 on oxide dielectric 613 is non-crystalline layer, surrounds intrinsic base and pick up base by metal contacts 606.

an emitter 610, a polysilicon layer with first electric type doping, being picked up by metal contacts directly. Intrinsic base 611 is as large as poly emitter 610 or smaller than poly emitter 610 to ensure the impurities of extrinsic base implant do not dope intrinsic base 611.

For NPN transistors, first electric type is N type, second electric type is P type. For PNP transistors, first electric type is P type, second electric type is N type.

Pseudo buried layers 602 are fabricated at the bottom of STI, surround active area and connected to collector 614 by lateral diffusion into active area. Pseudo buried layer implant conditions are as following, N type as first electric type impurity: dose range 1e14~1e16 cm$^{-2}$, energy less than 5 keV, the impurity can be Arsenic or Phosphorus; P type as first electric type impurity: dose range 1e14~1e16 cm$^{-2}$, energy less than 5 keV, the impurity can be Boron, BF2 or Indium.

The active area can have different widths for different breakdown voltages of HV bipolar transistors. The breakdown voltages of HV Bipolar transistors can be adjusted by tuning active CDs.

Figure 3:
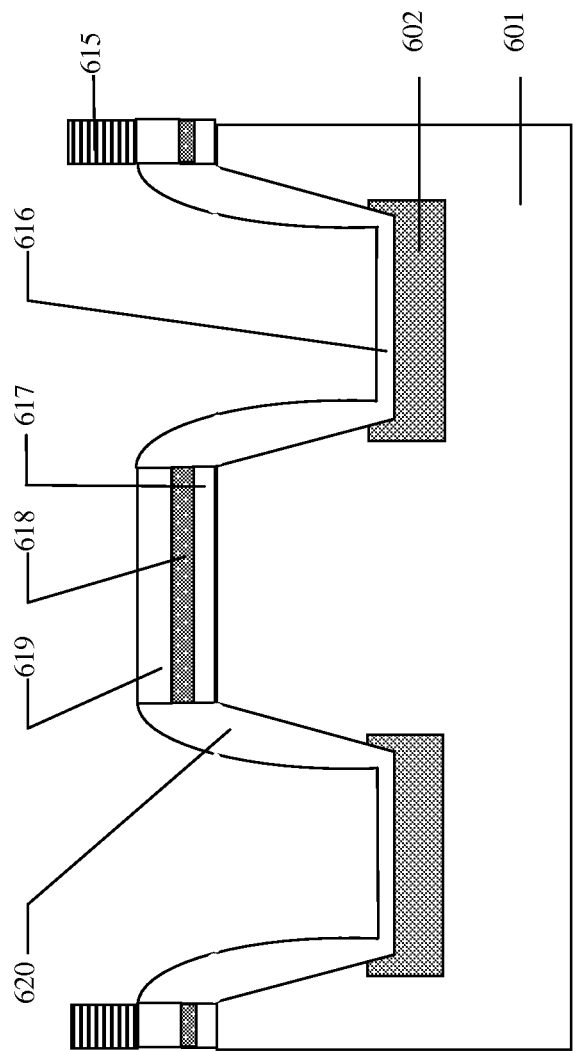
FIG. 3~FIG. 5 are schematic views showing the fabrication steps of HV bipolar transistors in this invention.
Figure 4:
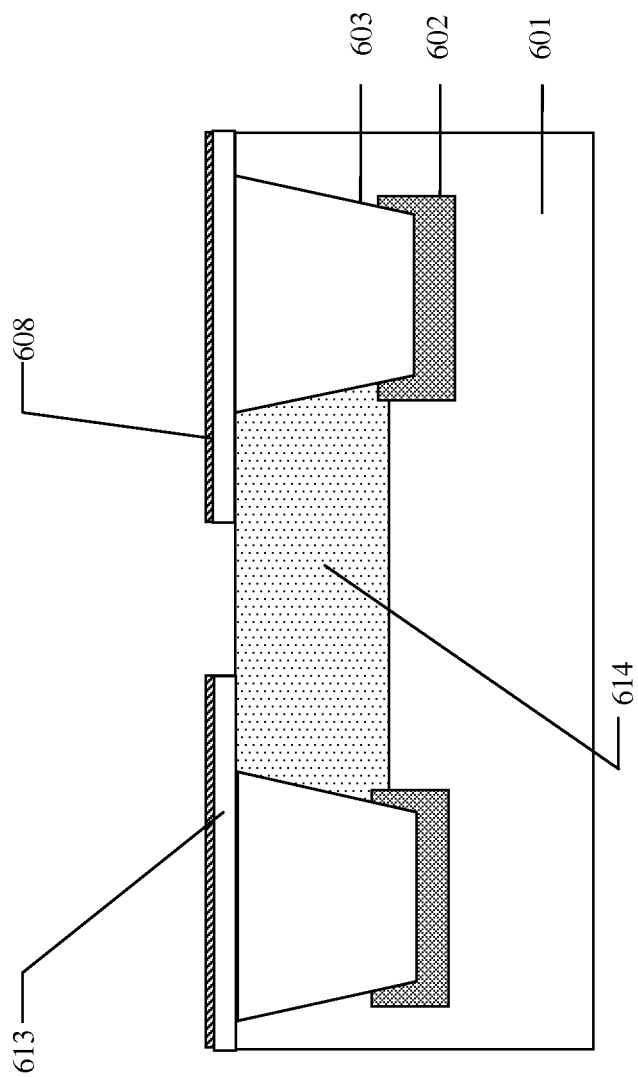
Figure 5:
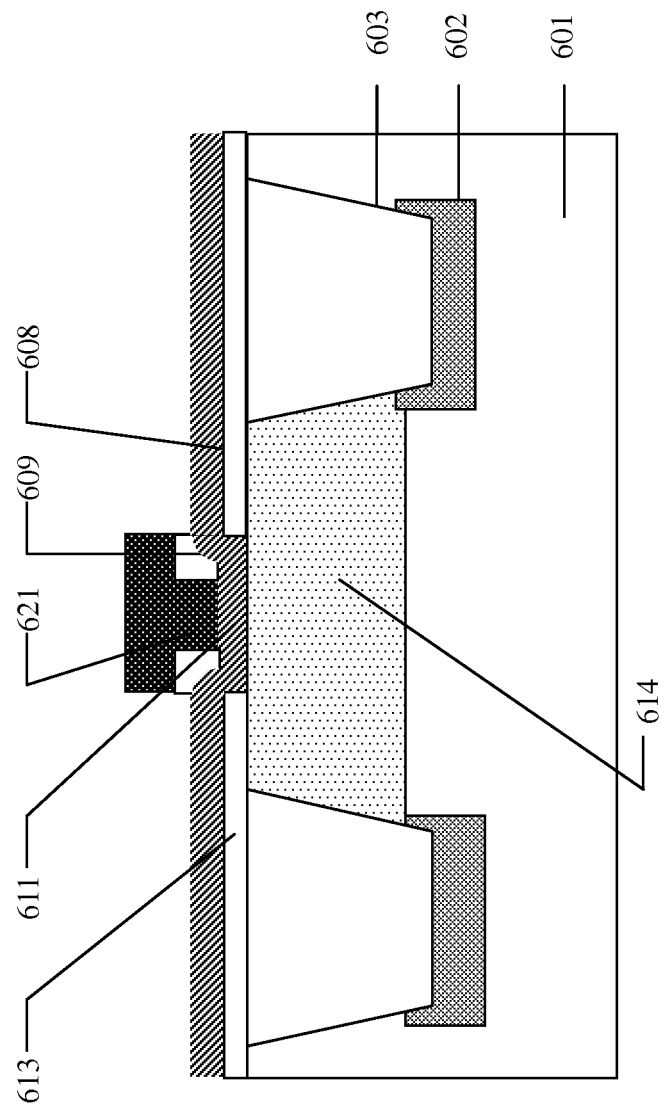

FIG. 3~FIG. 5 are schematic views showing the fabrication steps of HV bipolar transistors in this invention. The fabrication process steps are as following:

1. As illustrated in FIG. 3, The hard mask layers of oxide film 617, nitride film 618 and another oxide film 619 are deposited on P type substrate 601 for STI selective etch. Total hard mask thickness depends on pseudo buried layer implant energy to prevent the impurities from penetrating hard mask.

2. As illustrated in FIG. 3, STI area is opened with active photography and etched to form STI.

3. As illustrated in FIG. 3, HTO oxide layer 616 is deposited after STI thermal oxidization and dryly etched to form STI side wall 620.

4. As illustrated in FIG. 3, the area of HV bipolar transistor is opened by photography. First electric type impurity is implanted into P type substrate 601 to form pseudo buried layer 602. The area except HV bipolar transistor is covered by photo resistor 615. Pseudo buried layer implant dose range is 1e14~1e16 cm$^{-2}$, and implant energy range is 2~50 KeV, implant species is N type for NPN and P type for PNP.

5. As illustrated in FIG. 3, oxide layer 619 is removed by wet dip. The implants penetrate oxide 617 and nitride 618 to form collector. The implant impurity is N type for NPN and P type for PNP. The implants into collector can be single one or multiple steps. The implant dose and energy can be determined by transistor breakdown voltage.

6. As illustrated in FIG. 4, field oxide HDP 603 is filled in STI and planarized by Chemical Mechanical Planarization (CMP). Hard mask is removed by wet etch.

7. As illustrated in FIG. 4, CMOS devices are fabricated on the area except bipolar transistor region. The CMOS process comprises gate oxide, gate formation, MOSFET spacer, etc.

8. As illustrated in FIG. 4, oxide layer 613 and polysilicon layer 608 are deposited for defining the base window. The thicknesses are 100 Å~500 Å, 200 Å~1500 Å, respectively.

9. As illustrated in FIG. 4, base window is opened by photography and etch. Base window edge aligns with poly emitter edge.

10. As illustrated in FIG. 5, Silicon buffer layer, in-situ doping base 611 and silicon cap layer are grown on collector. Base doping is P type impurity for NPN and N type impurity for PNP. Each layer thickness and base doping concentration can be designed to meet the requirement of transistor characteristic.

11. As illustrated in FIG. 5, the dielectric layer 609 is deposited on base for emitter window open. Its thickness is determined according to emitter window width. The layer may be single oxide layer or stack layers of oxide/nitride or oxide/poly.

12. As illustrated in FIG. 5, emitter window 610 is opened by photography and etch.

13. As illustrated in FIG. 5, in-situ polysilicon emitter is deposited. The doping impurity is N type for NPN and P type for PNP. The high dose implant is done into emitter. The implant dose is higher than 1e15 cm$^{-2}$. The implant energy is related to emitter thickness.

14. As illustrated in FIG. 5, poly emitter is etched.

15. As illustrated in FIG. 2, oxide film is deposited and is dryly etched to form emitter spacer 612.

16. As illustrated in FIG. 2, poly SiGe of extrinsic base is etched.

17. As illustrated in FIG. 2, interlayer dielectric (ILD) 605 between silicon and metal layer is deposited. The layer can be BPSG or PSG.

18. As illustrated in FIG. 2, deep contacts are formed by etching in STI.

19. As illustrated in FIG. 2, Conventional contacts of base and emitter are formed.

20. As illustrated in FIG. 2, Buffer layer Ti/TiN is coated and Tungsten is plugged in contact holes. CMP makes planarization.

21. As illustrated in FIG. 2, first metal layer is deposited and metal line 607 is formed by photography and etch.

22. As illustrated in FIG. 2, other backend processes are same as conventional.

Figure 6A:
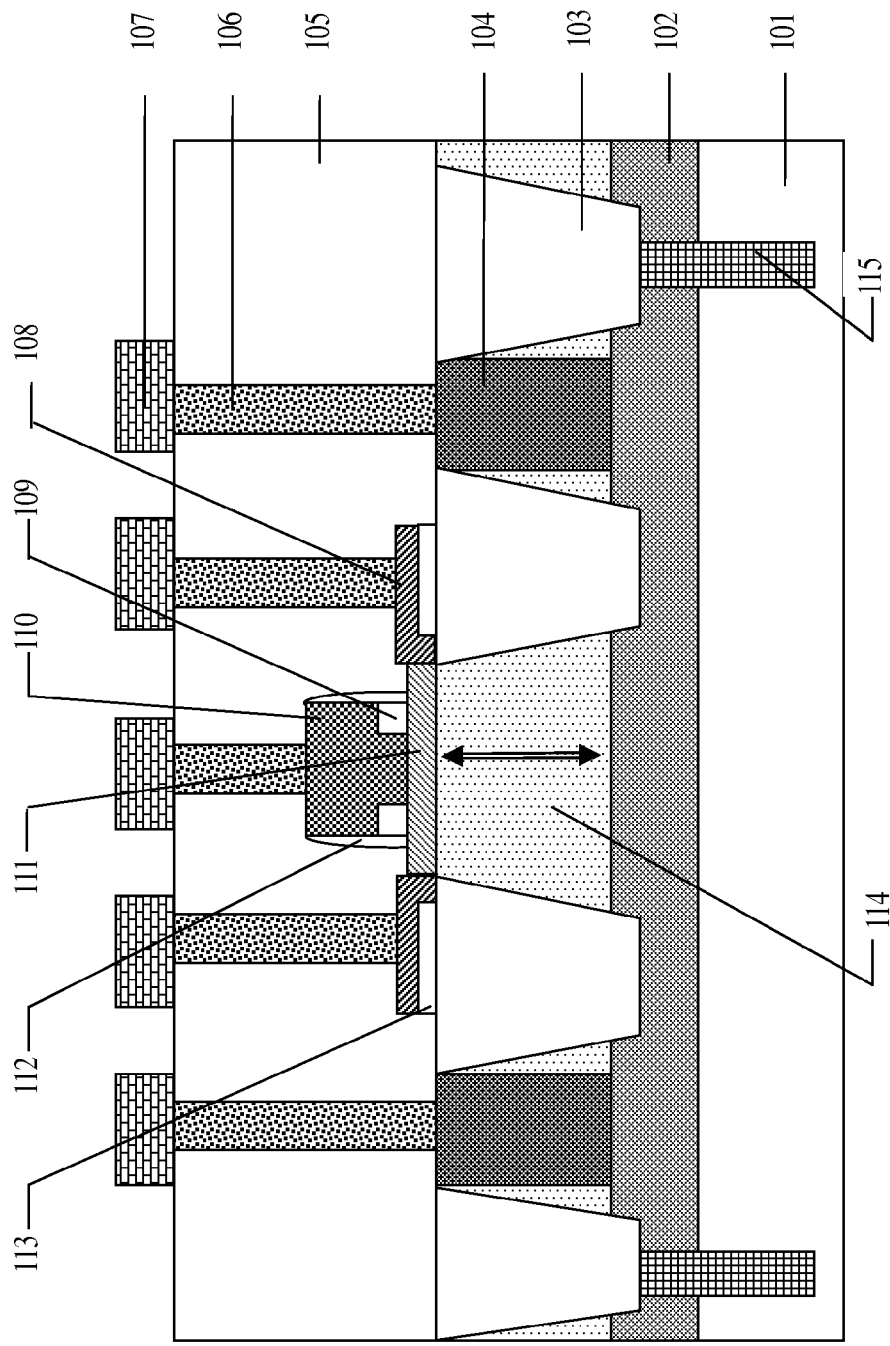
FIG. 6A shows the spreading direction of collector/base junction depletion region in conventional bipolar transistors.
Figure 6B:
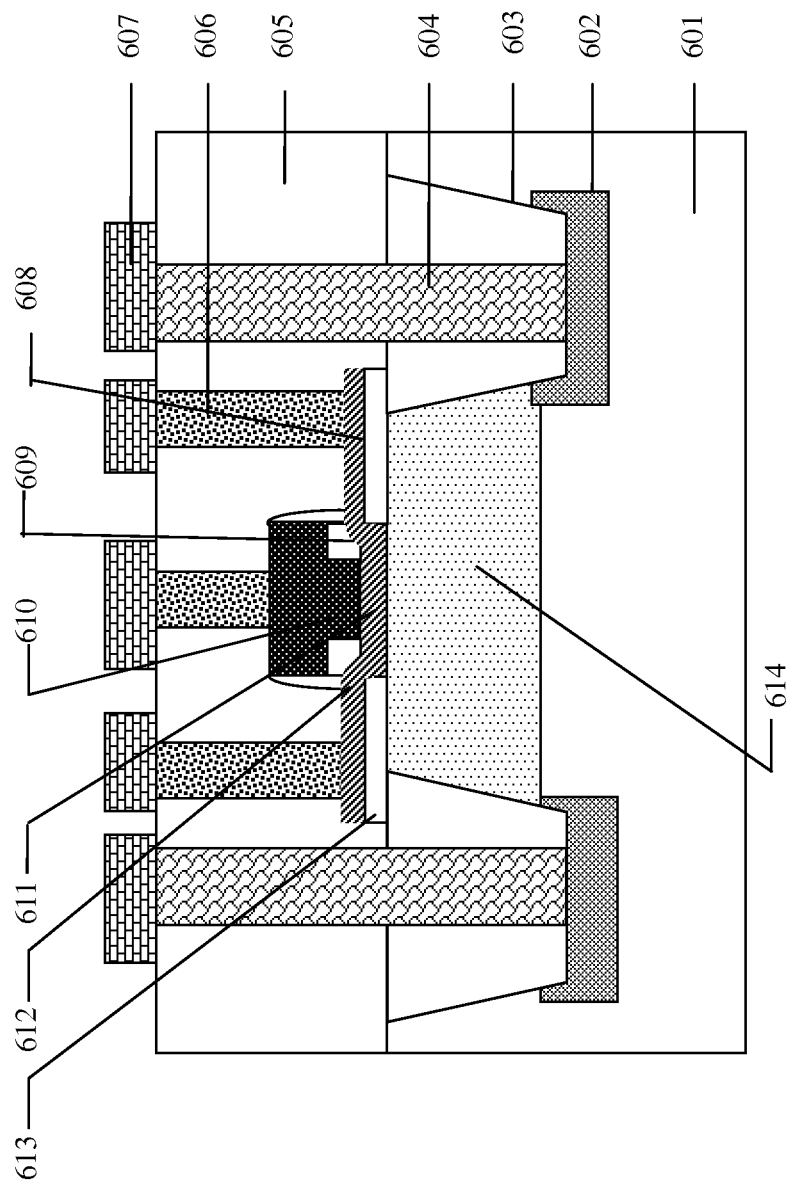
FIG. 6B shows the spreading directions of collector/base junction depletion region in HV bipolar transistors of this invention.

FIG. 6A shows that the spreading direction of collector/base junction depletion region in conventional bipolar transistors is mainly vertical. FIG. 6B shows that the spreading directions of collector/base junction depletion region in HV bipolar transistor of this invention are both vertical and lateral. In this invention, larger active CD increases collector/base junction depletion width and furthermore increases transistor breakdown voltages. Therefore the breakdown voltage of HV bipolar transistor in this invention can be adjusted by modifying active lateral size. However the breakdown voltage of conventional bipolar transistor can only be tuned by different collector epitaxial thicknesses. This invention is low-cost process and is easy to integrate with high frequency devices.

Figure 7:
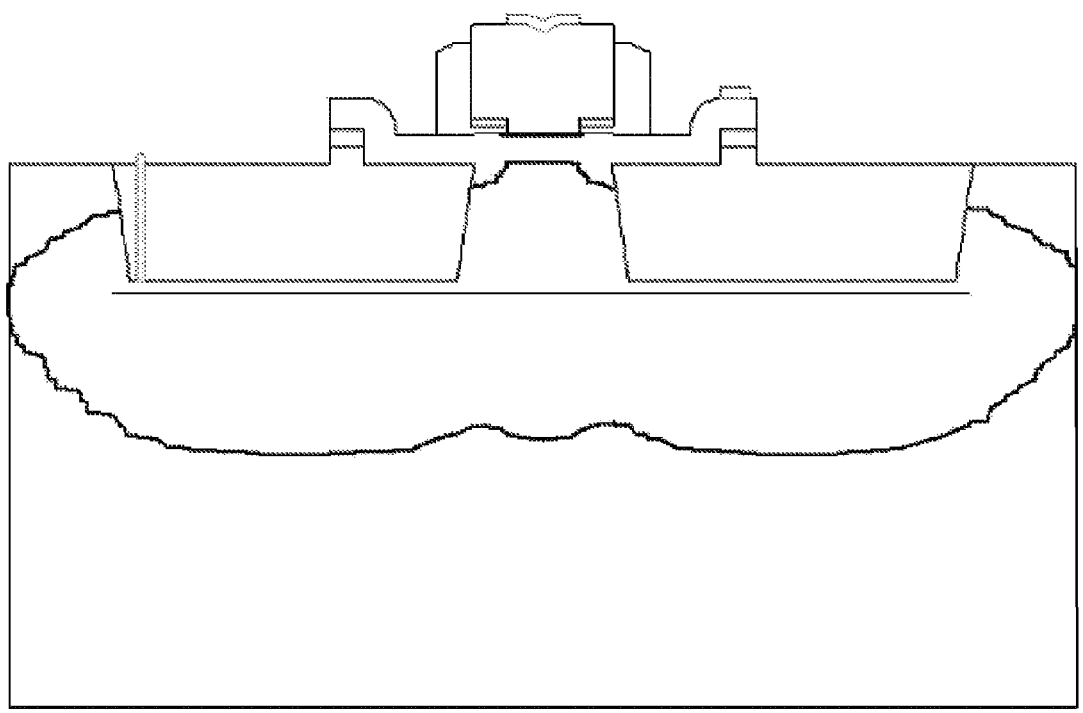
FIG. 7 shows TCAD simulated HV bipolar transistor structure of this invention.

FIG. 7 shows TCAD simulated HV bipolar transistor structure of this invention.

Table 1 shows TCAD simulated relation of HV bipolar transistor breakdown voltages and active CDs on this invention:

TABLE 1

| | Active CD (Micron) | | | |
|---|---|---|---|---|
| | 2 | 1.8 | 1.5 | 0.8 |
| BVcbo (V) | 20.2 | 20 | 19.9 | 15.5 |

As illustrated in table 1, the breakdown voltages of HV bipolar transistors in this invention increases with larger active CDs and saturates with large enough active area. The breakdown voltage of HV bipolar transistor in this invention can be adjusted by modifying active lateral size.

It will be apparent to those skilled in the art that various modifications and variations can be made in the fabrication method for a HV bipolar transistor of the invention without departing from the spirit or scope of the invention. Thus, it is intended that the present invention cover the modifications and variations of this invention provided they come within the scope of the appended claims and their equivalents.

The invention claimed is:

1. A high voltage bipolar transistor with shallow trench isolation (STI) on bulk silicon substrate comprises,
   areas of a collector formed by implanting a first electric type impurity into an active area and connected with pseudo buried layers at two sides;
   the pseudo buried layers which are formed by implanting a high dose first type impurity into the bulk silicon substrate through the bottom of the STI at two sides forming PN junctions, do not touch directly and are linked up by the collector;
   when the first electric type of doping impurities is N type: dose range is 1e14~1e16 $cm^{-2}$, energy is less than 5 keV, the high dose first type impurity implanted into the pseudo buried layers impurity is either Arsenic or Phosphorus;
   when the first electric type of doping impurity is P type: dose range is 1e14~1e16 $cm^{-2}$, energy is less than 5 keV, the high dose first type impurity implanted into the pseudo buried layers impurity is Boron, BF2 or Indium;
   deep contacts formed by implanting metals through oxide of interlayer dielectric and STI to contact the pseudo buried layers and pick up the collector;
   a base being deposited on the collector by epitaxial growth and in-situ doped by a second electric type impurity, in which an intrinsic base touches the collector and an extrinsic base is used for base pick-up;
   an emitter which is a polysilicon layer being deposited on the intrinsic base and doped with the first electric type impurity, and being picked up by a metal contact directly.

2. A high voltage bipolar transistor as claimed in claim 1,
   for a NPN transistor, the first electric type of doping impurity is N type, and the second electric type of doping impurity is P type;
   for a PNP transistor, the first electric type of doping impurity is P type, and the second electric type of doping impurity is N type.

3. A high voltage bipolar transistor as claimed in claim 1, wherein the pseudo buried layers are fabricated at the bottom of STI, surround active area and are connected to the collector by lateral diffusion into active area.

4. A high voltage bipolar transistor as claimed in claim 1, wherein the intrinsic base has a size equal or smaller than the size of a poly emitter to ensure the impurity of extrinsic base implant does not dope intrinsic base.

5. A high voltage bipolar transistor as claimed in claim 1, wherein breakdown voltages of HV bipolar transistors are adjusted by tuning active CDs.

6. A high voltage bipolar transistor as claimed in claim 5, wherein the first electric type of doping impurity implants in the collector is single implant or multiple implants;
   an implant energy is lower than 500 KeV, and implant dose is lower than 1e14 $cm^{-2}$;
   the implant dose and the implant energy correspond to the breakdown voltages.

7. A high voltage bipolar transistor as claimed in claim 1, wherein the deep contact in the collector is coated with Ti/TiN buffer metal layers followed by being plugged in Tungsten.

8. A high voltage bipolar transistor as claimed in claim 1, wherein the first electric type of doping impurity of high dose is implanted into the bottoms of the deep contact in the collector after the deep contact etch to realize ohmic contacts of the collector.

9. A high voltage bipolar transistor as claimed in claim 1, wherein the base being deposited on the collector by the epitaxial growth is Silicon, SiGe or SiGeC.

* * * * *